US010762979B2

(12) United States Patent
Raychaudhuri et al.

(10) Patent No.: US 10,762,979 B2
(45) Date of Patent: Sep. 1, 2020

(54) DATA RETENTION IN STORAGE DRIVES

(71) Applicant: International Business Machines Corporation, Armonk, NY (US)

(72) Inventors: Arindam Raychaudhuri, Bangalore (IN); Diyanesh B. Chinnakkonda Vidyapoornachary, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/173,627

(22) Filed: Oct. 29, 2018

(65) Prior Publication Data
US 2020/0135293 A1 Apr. 30, 2020

(51) Int. Cl.
*G11C 29/52* (2006.01)
*G11C 29/04* (2006.01)
*G06F 3/06* (2006.01)
*G06F 9/54* (2006.01)

(52) U.S. Cl.
CPC ............ *G11C 29/52* (2013.01); *G06F 3/0619* (2013.01); *G06F 3/0638* (2013.01); *G06F 3/0653* (2013.01); *G06F 9/542* (2013.01); *G11C 29/04* (2013.01); *G11C 2029/0407* (2013.01); *G11C 2029/0411* (2013.01)

(58) Field of Classification Search
CPC ...................................... G11C 29/52
USPC ................................ 714/764, 766, 768, 773
See application file for complete search history.

(56) References Cited

U.S. PATENT DOCUMENTS

| 9,384,124 | B2* | 7/2016 | Yamanaka | G06F 12/0246 |
| 9,569,120 | B2 | 2/2017 | Ryan et al. | |
| 9,639,283 | B2 | 5/2017 | Ryan et al. | |
| 2009/0070651 | A1* | 3/2009 | Diggs | G06F 11/1068 714/752 |
| 2011/0231730 | A1 | 9/2011 | Allen | |
| 2011/0320915 | A1 | 12/2011 | Khan | |
| 2013/0067138 | A1 | 3/2013 | Schuette et al. | |
| 2014/0237315 | A1* | 8/2014 | Fitzpatrick | G06F 11/1012 714/755 |
| 2014/0304455 | A1* | 10/2014 | Scaramuzzo | G06F 12/0246 711/103 |

(Continued)

OTHER PUBLICATIONS

Huang et al., "Chapter 20: Data Center IT Efficiency Measures," The Uniform Methods Project: Methods for Determining Energy Efficiency Savings for Specific Measures, Sep. 2011-Dec. 2014 (Subcontract Report Jan. 2015), 33 pages, National Renewable Energy Laboratory. https://www.energy.gov/sites/prod/files/2015/01/f19/UMPChapter20-data-center-IT.pdf.

(Continued)

*Primary Examiner* — Fritz Alphonse
(74) *Attorney, Agent, or Firm* — Jorge R. Maranto

(57) ABSTRACT

A method and a system for monitoring conditions of offline storage devices is disclosed. Predetermined environmental conditions are monitored to determine whether a storage device should be brought online to perform a data integrity check process. The process receives a triggering event that corresponds with the storage device, powers on the storage devices, selects a page from the storage device, and determines a bit error rate. Once the bit error rate is determined, error-correcting code runs to correct the errors. Any uncorrectable errors are reported, and the storage device is brought back offline.

20 Claims, 8 Drawing Sheets

(56) References Cited

U.S. PATENT DOCUMENTS

| | | |
|---|---|---|
| 2015/0134840 A1* | 5/2015 | Thompson ............... H04N 5/76 709/228 |
| 2015/0153962 A1 | 6/2015 | Salessi et al. |
| 2015/0169398 A1 | 6/2015 | Chunn et al. |
| 2016/0180953 A1 | 6/2016 | Darragh et al. |
| 2017/0131924 A1 | 5/2017 | Main et al. |

OTHER PUBLICATIONS

Kirsch, N., "SSD Data Retention Not Good When Unpowered," Legit Reviews, May 11, 2015, pp. 1-4. http://legitreviews.com/ssd-data-retention-not-good-when-unpowered_163326.

Schulz, G., "Shifting from energy avoidance to energy efficiency," StorageIOblog, Jun. 14, 2009, pp. 1-6. https://storageioblog.com/shifting-from-energy-avoidance-to-energy-efficiency/.

* cited by examiner

DATA RETENTION IN STORAGE DRIVES

BACKGROUND

Embodiments of the present disclosure relate to improving data retention in storage drives, and more specifically, to improving data retention of offline storage drives by monitoring environmental conditions.

Companies in various industries are transitioning to flash-based storage solutions in order to keep up with competitors, to modernize data protection, and to deliver a better customer experience. Flash-based storage solutions can offer a significant boost in application performance and efficiency while also enabling businesses to expand their storage needs with a flexible architecture designed to keep pace with their demands.

However, flash-based storage solutions, and more specifically, NAND-based flash drives can be impacted by environmental conditions. Temperature and humidity adversely impact the data retention ability in flash drives. The higher temperatures that a flash drive may be subjected can cause an acceleration of charge de-trapping mechanisms. This can lead to data bit failures on the drive.

SUMMARY

According to an embodiment of the present disclosure, a process for performing a data integrity check on offline storage drives is disclosed. The process begins by receiving a triggering event that corresponds to the storage drive. The triggering event that is received is a predetermined condition. Next, powering on the storage drive and selecting a page held within the storage drive. Once the page is selected, determining a bit error rate of the page. Once a bit error rate is calculated, determining whether the bit error rate exceeds a bit error rate threshold. The bit error rate threshold is a predetermined threshold that is set prior to the operation of the process. Upon determining that the bit error rate exceeds the bit error rate threshold, scrubbing all pages held within the storage drive. Upon determining that the bit error rate does not exceed the bit error rate threshold, scrubbing the page. The process proceeds by recording any uncorrectable data within the storage drive and powers down the storage drive.

According to an embodiment of the present disclosure, a system for performing a data integrity check on offline storage drives is disclosed. The system includes a storage drive configured to store data, wherein the data is divided into pages of information. The system further includes a load balancing server and a power management unit operably connected to the load balancing server. The power management unit is configured to communicate a power status of the storage drive to the load balancing server as well as to provide power to the storage drive. The system also includes an environmental monitoring server operably connected to the load balancing server. The environmental monitoring server includes a plurality of sensors configured to monitor and sense a plurality of environmental conditions. The system also includes a service host configured to execute an instruction on execute an instruction on the storage system upon determining a triggering event, the service host further configured to receive the environmental conditions and the power status to determine the triggering event. The storage drive further configured to receive the instruction from the service host and to check the pages for a bit error rate, to scrub the pages containing errors, and to record each page that contains an uncorrectable error.

BRIEF DESCRIPTION OF THE DRAWINGS

These and other features, aspects, and advantages of the embodiments of the disclosure will become better understood with regard to the following description, appended claims, and accompanying drawings where:

Figure 1:
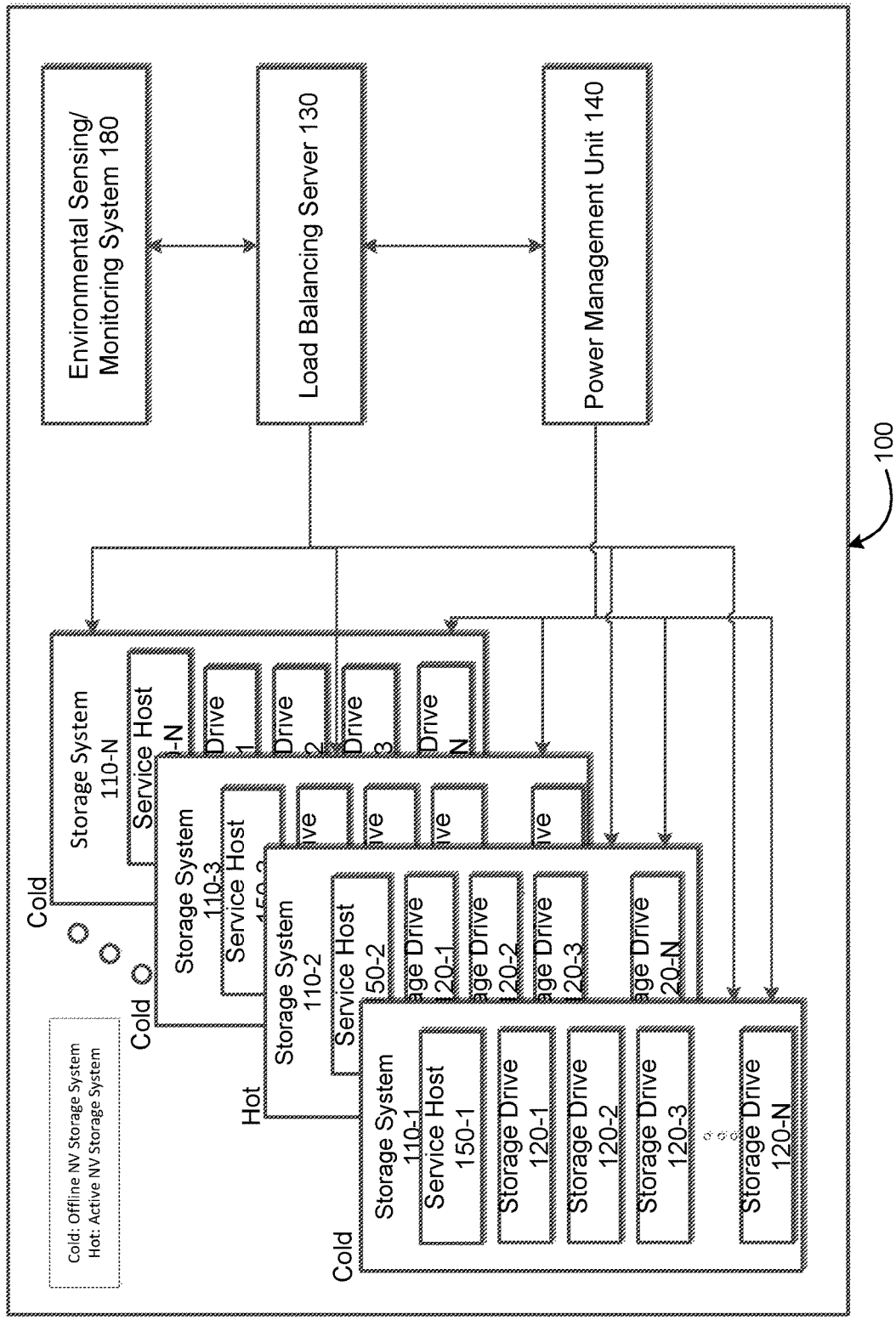
FIG. 1 is a block diagram illustrating a data retention system designed to store enterprise-level data, according to embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention. Like reference numerals are used to designate like parts in the accompanying drawings.

DETAILED DESCRIPTION

In the Summary above, in the Detailed Description, in the claims below, and in the accompanying drawings, reference is made to particular features (including process steps) of the disclosure. It is to be understood that the disclosure of the invention in this specification includes all possible combinations of such particular features. For example, where a particular feature is disclosed in the context of a particular aspect or embodiment, or a particular claim, that feature can also be used, to the extent possible, in combination with and/or in the context of other particular aspects and embodiments, and in the disclosure generally.

Storage drives have a higher probability of data corruption when exposed to harsh environmental conditions, and they may also suffer data corruption if powered down for long periods of time. This is especially true for NAND-based flash drives. Typically, storage devices automatically run periodic error-correcting code while they are powered on and online. This is not the case for offline devices as they have no way of monitoring conditions or running preventative code. To preserve the data held within the storage devices, a storage device monitoring process is introduced. Offline storage devices, such as storage systems and storage drives, may need to run error-correcting code to due to data corruption. The monitoring process facilitates the need of running error correction for offline storage devices.

As such, the storage device monitoring process monitors environmental conditions as well as the periods of time that the storage devices are offline and powered down. Upon receiving a triggering event, such as a temperature threshold, the process powers on the storage device and proceeds to run the process to preserve the data that may have become corrupted.

FIG. 1 is a block diagram illustrating a data retention system 100, according to embodiments. The data retention system includes one or more storage systems 110-1, 110-2, 110-3, 110-N (collectively "storage system 110"), one or more storage drives 120-1, 120-2, 120-3, 120-N (collectively "storage drive 120"), a load balancing server 130, a power management unit 140, a service host 150, and an environmental condition monitoring system 180. The storage drive 120 is communicatively coupled to the storage system 110. The load balancing server 130 is communicatively coupled to the storage system 110 and is configured to distribute network traffic. The power management unit 140 is communicatively coupled to the load balancing server 130 and is configured to supply power to the storage system 110. The environmental condition monitoring system 180 is communicatively coupled to the load balancing server 130. The service host 150 is executed on the storage system 110 and is configured to execute an instruction when a predetermined triggering event occurs.

The data storage system 110 is a storage device that contains the storage drives 120. The data storage system 110 manages the data held within each storage drive 120 connected to the storage system 110. In some embodiments, the storage drives are typically arranged into logical, redundant storage configurations or redundant array of independent disks (RAID) configurations. For example, data stored within the storage system may be striped across all storage drives installed within the storage system. Various RAID configurations also offer techniques of striping, mirroring, or providing parity to the data depending on the RAID level configuration that is implemented. Also, the storage system 110 is configured to manage the data stored within the storage drives and to provide data access across a network. To facilitate the management of the data, storage systems 110 are configured to receive a set of instructions that instruct the storage system 110 to manipulate the data.

In some embodiments, the data storage system 110 is a network-attached storage (NAS) device. An NAS is a dedicated file storage server that provides data from a centralized area. An NAS enables multiple users and devices to access the data stored in the NAS over a network, while also maintaining security and maintenance of the stored data.

In some embodiments, the data storage system 110 is an enterprise-class storage system installed within a data center. The enterprise system is capable of installing multiple storage drives into a single system while also being capable of communicating with other enterprise systems in a coordinated approach to data management. Enterprise systems provide enhanced security, data reduction options, high scalability, and offer a multitude of customizable options that can be implemented to manipulate the stored data.

Other embodiments of the data storage system 110 include file servers, direct-attached storage (DAS), storage area network (SAN), clustered NAS, and any other known network storage implementation. Embodiments of the data storage system 110 are also configured to operate on multiple network protocols such as file transfer protocol (FTP), hypertext transfer protocol (HTTP), network file system (NFS), Andrew file system (AFS), or any other network protocol capable of facilitating a transfer of information.

The storage drive 120 is a device capable of storing non-volatile memory in a storage medium. The storage drive 120 is configured to retrieve stored data after the drive has been power cycled and to transmit the data across a system. The storage drive 120 provides permitted devices with access to various types of data stored on the storage drive 120. Data stored within the storage drive 120 can be divided into pages in a paged memory management scheme with each page being a fixed-length contiguous block of virtual memory. However, other methods and approaches of memory division and management exist.

The storage drive 120 may comprise magnetic media, hard disk media, and/or solid state media. While certain descriptions herein refer to solid state memory generally, it is understood that solid state memory may comprise one or more of various types of solid state non-volatile memory drives such as flash integrated circuits, NAND memory (e.g., single-level cell (SLC) memory, multi-level cell (MLC) memory, or any combination thereof), NOR memory, and electrically erasable programmable read-only memory (EEPROM).

The load balancing server 130 is a device (e.g., physical computer system or a virtual computer system provided by a virtual computer system service) configured to utilize one or more load balancing techniques (e.g., round robin, least connections, chained failover, weighted response time, etc.) to distribute requests given to the system. In some embodiments, the capabilities of the load balancing server 130 can be incorporated into one or more other computing resources on a client-side system and/or on other computing resources offered by a service provider. For example, a client can incorporate a load-balancing application that performs the functions of the load balancing server 130. Thus, the information provided by the client can dictate how the request is handled.

In some embodiments, the load balancing server 130 is configured to distribute workloads across multiple computing resources. For example, other computing resources may be computers, computer clusters, network links, storage systems, storage drives, central processing units, and the like. The load balancing server 130 distributes service hosts and other requests in order to optimize resource use, maximize throughput, minimize response time, and avoid overloading any single resource. In larger systems, loading balancing is typically performed by a dedicated load balancing server 130 or other similar hardware such as a Domain Name System (DNS) server.

The power management unit 140 is any device, module, component, or combination thereof, that can be used to distribute electrical power. Embodiments of the power management unit 140 may be embodied in a single component or as an assembly (such as a transformer and a rack power management unit housed in an enclosure) or can be distributed among two or more components or assemblies. In one embodiment, the power management unit 140 includes features such as power monitoring, power status, fault detection, and isolation.

In some embodiments, the power management unit 140 is a primary power system that includes an uninterruptible power supply (UPS) held within a data center. The power management unit 140 can provide power to various racks containing an array of servers and various other components. Each component held within the racks can be independently supplied power which the power management unit 140 is able to monitor and supply information about.

For example, a storage system 110 can be installed within a rack in a data center that is connected to a power management unit 140. The power management unit 140 can have the capabilities to power on and off the storage system, retain information pertaining to the time and date when the storage system 110 was powered off or on, as well as provide that information to other components held within the data center.

The service host 150 is software used to execute services on various platforms. For example, an OS of a host computer, guest OS of a VM, container in an OS, and the like. In general, a service host 150 hosts one or more service instances. As used herein "service instance" is an object within a service host that handles requests targeting a service. For example, if a service host is an object-oriented process, a service instance can be an object instantiated in the process. As used herein, "request" is a message mapped to an action of the application programming interface (API). A service host 150 can execute directly on an OS kernel or within a runtime environment. In another example, a given host environment can host one or more service hosts 150. Each host can be assigned a different IP address and/or TCP port. In one embodiment, the service host 150 contains services that share a single process that conserves computing resources while streamlining the service requirements.

A service is implemented by one or more service instances within one or more service hosts 150. Services can be instantiated across a plurality of service hosts 150. For example, a given service can be implemented using a plurality of service instances across a plurality of service hosts. In some embodiments, the service host 150 provides a framework that provides runtime support for service instances. The framework provides a plurality of functions such as replication, synchronization, ordering, and service state.

In one embodiment, the service host 150 includes a plurality of service objects, which are service instances of one or more user-created services. The service host 150 can also include user-created objects, which can be used to create service objects on request.

In some embodiments, the service host 150 receives environmental conditions of storage systems 110 held within a data center. The service host 150 is also configured to determine which storage systems 110 have reached a temperature threshold that has been predetermined by a user, administrator, or by a default threshold. The service host also receives a power status of each storage system 110 and determine if a user-defined length of time has passed for each individual storage system 110 that is powered off. The service host 150 can also be configured to receive information about various other components within a system. For example, instead of receiving information and conditions regarding a storage system, a service host can receive information and conditions regarding a storage drive.

Figure 2:
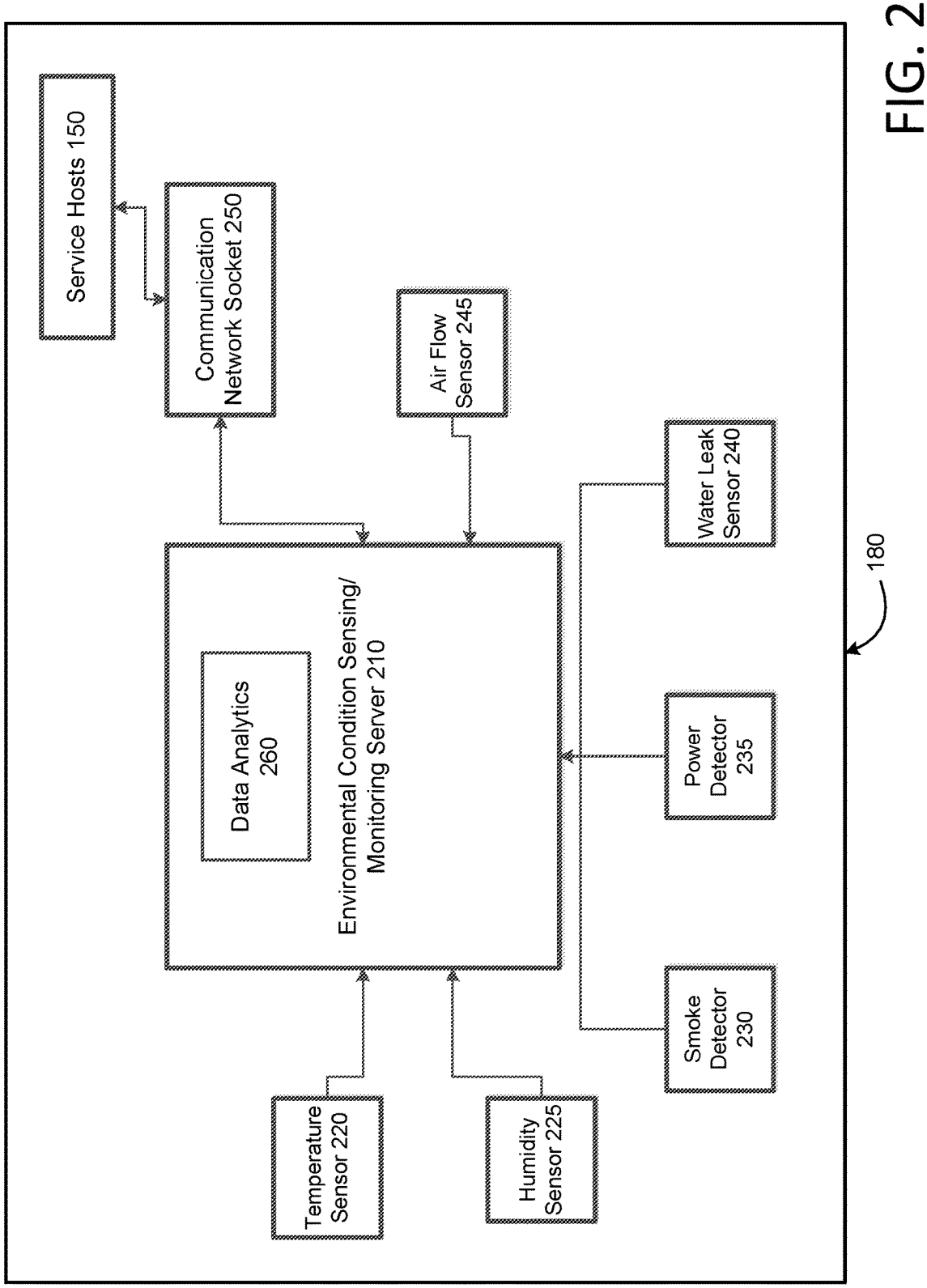
FIG. 2 is a block diagram illustrating an environmental condition monitoring system designed to monitor environmental conditions, according to embodiments.

The environmental condition monitoring system 180 is a component of the data retention system 100 that simultaneously measures and manages sensors installed on both logical and physical IT infrastructure. FIG. 2 is a block diagram of the environmental condition monitoring system 180, according to illustrative embodiments. The monitoring system 180 includes an environmental condition sensing/monitoring server 210, a temperature sensor 220, a humidity sensor 225, a smoke detector 230, a power detector 235, a water leak sensor 240, an air flow sensor 245, a network socket 250, and a service host 150. However, embodiments can implement an assortment of sensors that monitor various types of conditions and are not limited to the sensors listed in FIG. 2. Each sensor is individually configured to monitor distinct environmental conditions of a given area. Each sensor may also be configured to sense a plurality of conditions. For example, a sensor may be able to sense the temperature as well as the humidity of a given area. The sensors also provide real-time sensor measurements regarding current conditions of an area. In some embodiments, the environmental sensors installed in an area are dependent on the needs of a given location. For example, some locations may only have a need to monitor temperature, while other locations may monitor temperature and humidity. Each monitored area can be adapted to only include sensors that are needed for that particular area.

The environmental condition sensing/monitoring server 210 is a component of system 180 that receives information from each sensor that is connected to the monitoring system 180. The monitoring server 210 is communicatively coupled with each sensor in order to receive the environmental data. In one embodiment, the monitoring server 210 is configured to communicate the data received by the sensors to other components. For example, the monitoring server 210 transmits to a service host 150, via a communication network socket 250, the humidity level of a zone.

In another embodiment, the monitoring server 210 may utilize the information gathered by the installed sensors to establish a baseline and generate recommendations. For example, the recommendations may improve energy efficiency, data retention, improved component longevity, and other improvements across a system.

The environmental condition sensing/monitoring server 210 is a server that receives information from each sensor that is connected to the monitoring system 180. The monitoring server 210 is communicatively coupled with each sensor in order to receive the environmental data. In one embodiment, the monitoring server 210 is configured to communicate the data received by the sensors to other components. For example, the monitoring server 210 transmits the humidity level of a zone to a service host 150 via a communication network socket 250.

In another embodiment, the monitoring server 210 can utilize the information gathered by the installed sensors to establish a baseline and generate recommendations. For example, the recommendations may improve energy efficiency, data retention, improved component longevity, and other improvements across a system. This can be implemented using data analytics 260 embedded within the monitoring server 210.

Although the monitoring server 210 is illustrated in FIG. 2 as comprising an element distinct from the other components in the monitoring system 180, the monitoring server 210 can include or be integrated with the sensors of the monitoring system 180. In addition, or alternatively, the monitoring server 210 can include a set of machine readable instructions to operate on a computing device. For example, the monitoring server can be integrated into another device or component that is separate and apart from the monitoring system but can receive the information provided by the sensors. In another embodiment, the monitoring server can include a plurality of monitoring servers 210 that are implemented within a given area and assigned to receive information from assigned sensors within range of their respective monitoring server 210.

The sensors 220, 225, 230, 235, 240, and 245 can be networked, in a wired and/or wireless manner with the monitoring server 210, to convey detected condition information to the monitoring server 210. As noted, the sensors detect conditions such as temperature, humidity, smoke, power, water leakage, and air flow. However, the detected conditions may, in addition or alternatively, include other environmental conditions capable of being detected.

In some embodiments, the monitoring system 180 is installed in a data center to monitor and manage a plurality of conditions. The monitoring system may have one or more temperature sensors installed in zones that are located by each storage system 110 installed in the data center. The monitoring system 180 can be configured to report the temperature changes of each individual storage system 110. For example, a temperature sensor can be installed at multiple locations on a rack that contains a plurality of storage systems mounted to the rack. Each temperature sensor is configured to report a temperature reading but also a location where the sensor is installed. This allows for adjustments to be made to areas that indicate an adverse temperature reading.

In some embodiments, the monitoring system 180 is encompassed within an environmental monitor sensor. For example, a temperature sensor 220 may encompass temperature functionalities while also being configured to communicate those readings to a service host 150 via a network socket 250.

Figure 3:
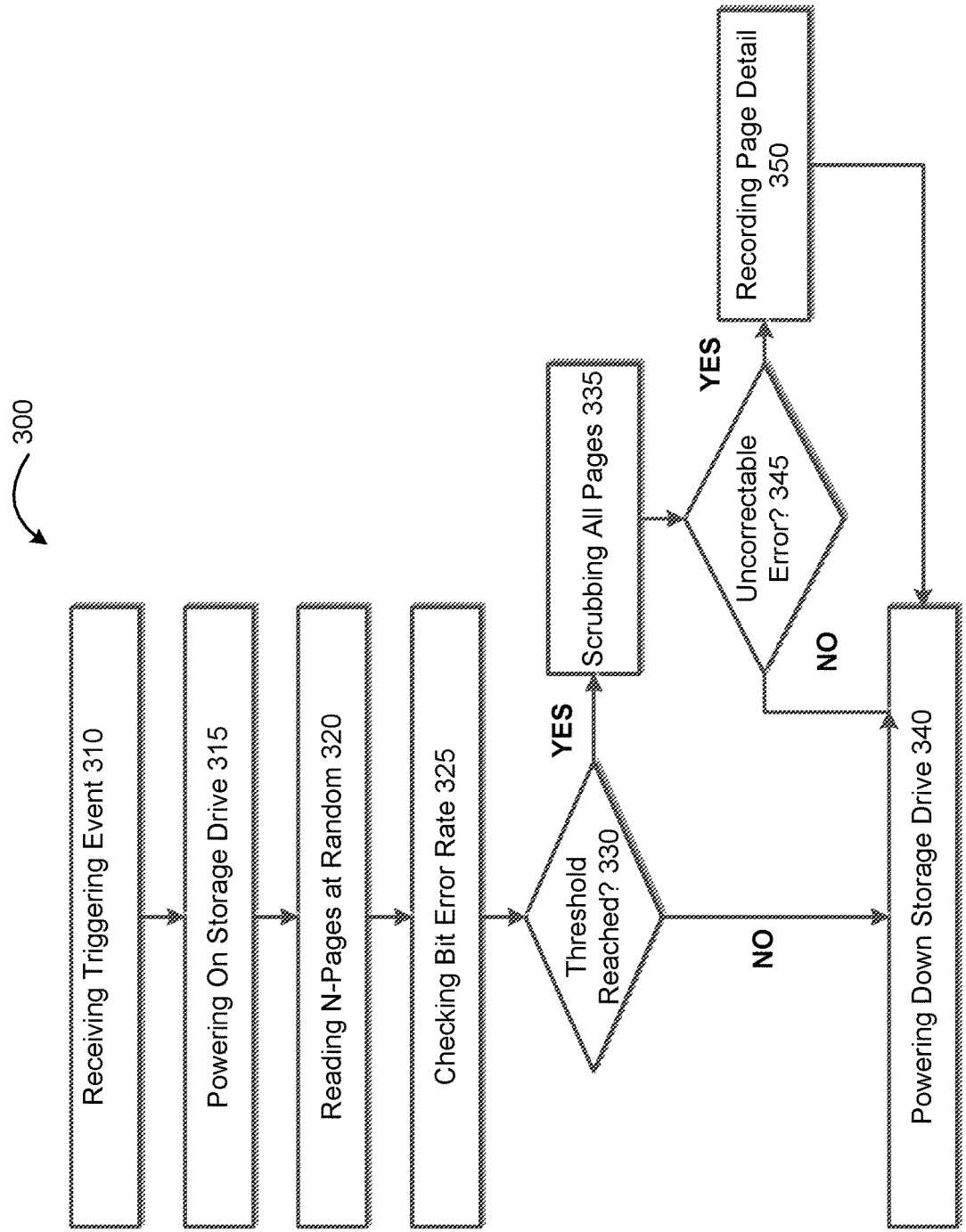
FIG. 3 is a flow diagram illustrating a process for performing a data integrity check on a storage drive, according to embodiments.

FIG. 3 is a flow diagram illustrating a process for performing a data integrity check process 300 according to one illustrative embodiment of the present disclosure. The data integrity check process 300 begins by receiving a triggering event. This is illustrated at step 310. The triggering event is a predetermined condition that is received to initiate the process. For example, a triggering event can be a temperature threshold that is reached by a storage system of FIG. 1. Other examples include, a predetermined length of time that a storage system has been offline, a user manually initiating the process, or some other environmental condition that is used to initiate the process. However, the triggering event can also be any type of condition that is set by a user or system.

In some embodiments, the storage system is installed within a data center and is monitored by a temperature sensor. The data integrity check process 300 is configured to receive a triggering event that is a temperature threshold reached by the offline storage system. For example, the triggering event can be a temperature threshold of 50° C. If the sensor monitoring the temperature of the storage system 110 relays a temperature reading at or above 50° C., the integrity check process 300 will initiate. In some embodiments, the length of time a storage system is offline is monitored and used as a triggering event. For example, a user may set the triggering event as a predetermined length of time (e.g., two days, three weeks, five months, etc.). Once the storage system has been offline for the predetermined length of time, the triggering event will be reached, and the integrity check process 300 will initiate.

In some embodiments, a triggering event is associated with a storage drive 120. For example, preconditions can be set for a triggering event to occur for a single storage drive 120. Environmental conditions and length of offline time of a storage drive can be monitored to determine whether a triggering event has occurred. However, it should be noted that the triggering event need not be limited to storage systems and storage drives, other components capable of being monitored can be configured to initiate a triggering event.

Upon receiving a triggering event, the integrity check process 300 proceeds by powering on a device associated with the triggering event. This is illustrated at step 315. In one embodiment, the storage drive is powered on by powering on a storage system. For example, a storage system 110 can have the storage drive installed within the system. The storage system 110 manages the power supplied to the storage drive and once the power is returned to the storage system, the storage drive can then be powered on.

In some embodiments, the storage drive is stored within an array of other storage drives in a storage system and held within a data center. A service host executes a command for a power management unit to bring the storage system back online in order for the storage drive to receive power. In some embodiments, the components of the aforementioned data center are located at separate sites and need not be held within one contiguous location. For example, a service host executing a power on command may be remotely initiated at an offsite location. The power management unit regulating the power to the various components of the data center can also be located offsite.

Once the storage drive 120 is powered on, the integrity check process 300 proceeds to read at least one page of memory stored on the storage drive 120. This is illustrated at step 320. In one embodiment, the step is performed by randomly reading a plurality of pages stored within the storage drive 120. The random selection of pages can be performed by various methods such as simple random sampling, systematic sampling, stratified sampling, cluster sampling, and various other sampling methods used to randomly select from a grouping. For example, each page can be given an equal probability of being read. The random selection allows the process to check the entire storage drive in an efficient manner.

In some embodiments, a storage system is powered on that contains a plurality of storage drives. Each drive is powered on and the integrity check process 300 randomly reads a plurality of pages across all the storage drives stored within the storage system. In another approach, the process can equally select a plurality of pages to be read from each drive to ensure that the same number of pages are being read across all drives.

In some embodiments, the pages that are read may be selected from hot spot areas in a storage system that typically run hotter due to the proximity of other storage drives as well as poorer air flow. For example, storage drives stored in the center of a storage system tend to be hotter than the storage drives stored toward the outer portions of the storage system. The storage drives stored in the hot spot areas can have a higher number of pages read to ensure that the integrity of those drives is maintained. Any other technique of reading a selection of pages, from a storage drive, are applicable, and the disclosure is not limited by the embodiments.

The storage drive reading the page also checks the bit error rate of the drive. This is illustrated at step 325. The bit error rate refers to the quantity of erroneous bits corresponding to an amount of erroneous data read from a storage drive, or storage system, during the reading operation divided by the total amount of data (e.g., the total amount of data stored in the storage drive or storage system) read during the reading operation (e.g., the data from the pages read). Other variations to determine the bit error rate may be used. For example, the ratio of erroneous data to correct data, percentage of data error, as well as other conceivable means.

In some embodiments, a plurality of storage drives in a storage system are checked for a bit error rate for all the drives. For example, a storage system can contain multiple storage drives and each drive will independently check the bit error rate and the total bit error rate of the storage system will be calculated by combining the error rate of each storage drive. In some embodiments, a plurality of storage systems containing a plurality of storage drives simultaneously check the bit error rate of each storage drive in all the storage systems and combined together to determine a total bit error rate. The bit error rate step is scalable to correspond to the amount of storage drives or storage systems that are associated with a particular triggering event. For example, if a temperature triggering event is received for several storage systems at one time, then all the storage systems that reached the temperature threshold can operate simultaneously to check the bit error rate. The scalability of the integrity check process 300 is configurable to suit the needs of the data center or system in which it operates.

The process proceeds to determine whether the bit error rate has reached a predetermined threshold. This is illustrated at step 330. As with the environmental threshold and time-based threshold, the bit error rate threshold, can be pre-configured as a user sees fit. For example, a user may set a threshold at two percent. In that, if the bit error rate reaches or exceeds a rate greater than or equal to two percent, then the integrity check process 300 can proceed to step 335. However, it should be noted if the bit error rate does not exceed two percent, then the process can proceed to step 340.

Upon determining that a bit error rate of a storage drive or storage system has reached a bit error rate threshold, the integrity check process proceeds with the scrubbing process. This is illustrated at step 335. Scrubbing is an error correction technique for fixing data errors. In some embodiments, scrubbing protects data against the failures corresponding with storage drives by reading data stored in the storage drive, removing errors found in the data, and rewriting corrected data that has been damaged. For example, the storage drive reads each page stored with data and checks the data for any errors. Various error detection techniques can be implemented such as repetition codes, parity bits, checksums, cyclic redundancy checks, error-correcting codes, or any other detection technique. If an error exists, other techniques can be implemented to correct those errors. Such techniques include automatic repeat request (ARQ), error-correcting code, hybrid ARQ, or other correcting techniques. The techniques implemented to detect and correct errors within data vary based on the manufacturer of the hardware storing the data, but any technique can be implemented to perform the process described herein.

In some embodiments, a RAID controller is used to read all storage drives that are connected to the RAID configuration. The RAID controller checks for errors in the connected storage drives and corrects all errors which can be corrected. For example, a storage system may comprise of multiple storage drives and utilize a RAID configuration to stripe data across all the storage drives. The storage system can then use the RAID controller to perform the scrubbing operation when necessary. In some embodiments, connected storage systems containing multiple storage drives each, simultaneously perform the scrubbing operation as necessary.

During the scrubbing operation, errors may exist within the data that cannot be corrected by the scrubbing operation. Upon determining that an error is uncorrectable, the process proceeds by recording a page detail of the uncorrectable error. This is illustrated at step 350. The recording operation can be completed in several ways. Depending on the architecture of the system, a register, page file, page table, or other referencing scheme can be utilized to determine the location of a page. For example, NAND-based storage devices can implement a register that is used to store the location of pages containing data. Utilizing the register, the process 300 can extract the location of the uncorrectable data for recording. In some embodiments, the recording is placed in a system log that is accessed by a service host for analysis. Also, in some embodiments, the recording is sent to an external location as dictated by a user implementing the integrity check process 300.

Recording the uncorrectable data assists users in determining defective storage drives that require replacement. Depending on the level of corruption, a storage drive may be deemed unreliable and should be replaced. Early detection of corrupt data ensures that steps can be taken to protect the data stored within a system. For example, storage drive replacement procedures can be implemented in areas such as data centers that instruct administrators to replace a storage drive that is no longer viable and has become a data liability. The recording log of uncorrectable data can be used as a metric in making those types of determinations.

At the completion of the integrity check process, the storage drive is powered down. This is illustrated at step 340. The step of powering down the storage drive can be reached in various ways. At step 330, if the bit error rate does not reach the bit error rate threshold, then the process proceeds by powering down the storage drive. At step 345, if all errors are correctable and corrected, then process also proceeds by powering down the storage drive. At step 350, once the uncorrectable errors are recorded, the process proceeds by powering down the storage drive.

Figure 4:
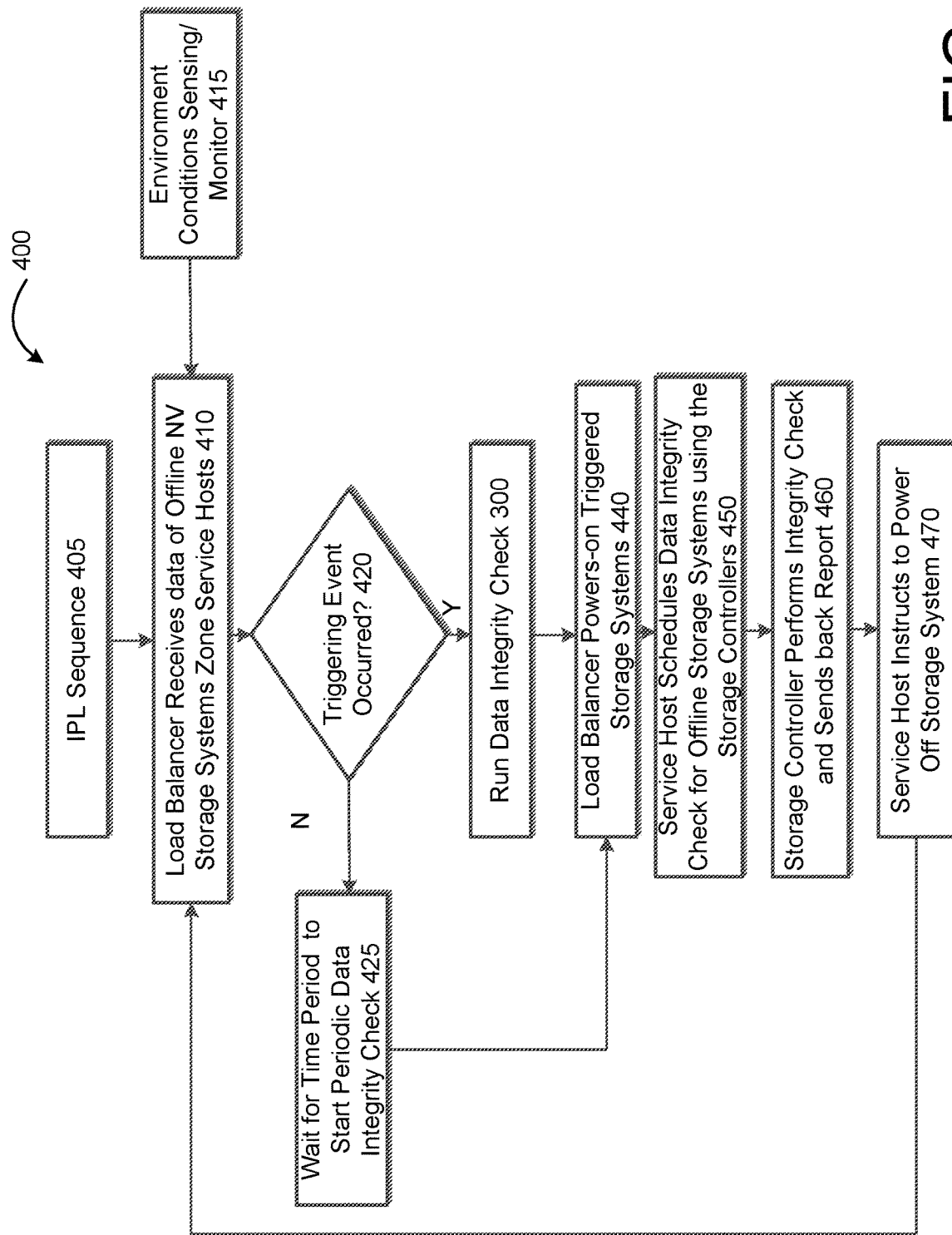
FIG. 4 is a flow diagram illustrating a process for a data center to perform a data integrity check process, according to embodiments.

FIG. 4 is a flow diagram illustrating a process of a system loading and performing a data integrity check process 400, according to one embodiment of the present disclosure. The process begins by initializing an operating system (e.g., Windows Server, Linux, Red Hat Enterprise Linus, z/OS, z/VM, z/VSE, and z/TPF). This process is typically referred to as an initial program load (IPL). This is illustrated at step 405. The IPL sequence is the step of loading a copy of the operating system from disk into the processor's real storage and executing it. To perform the step, the IPL sequence comprises steps of system and storage initialization, which include the creation of system component address spaces. Also, a master scheduler is initialized along with a subsystem initialization. An IPL sequence is performed when a system is first turned on or when a system is required to be reloaded.

According to some embodiments, systems continuously operate for long periods of times between reloads. For example, a z/OS system can operate for months at a time between reloads. However, a reload of the system, that requires the system to reinitialize the operating system may be required in certain instances. For example, a change in the system may be reason to reload a system. Implementing a data integrity check process may also require a system to reload which will require the IPL sequence to occur.

Upon completion of the IPL sequence, the process proceeds by having a centralized load balancing server receive data on the offline storage systems through the corresponding service hosts communicatively coupled to the overall system. This is illustrated at step 410. In one embodiment, a service host provides information that includes which storage systems are powered down. In another embodiment, each storage system is pinged to check if a storage system is accessible over a network. For example, a ping command can be sent to the address of each storage system. If a storage system is online and able to communicate over a network, the storage system will respond to the ping command and send back a packet as a reply.

The load balancer receives status information of the offline storage system. Also, the environmental condition monitoring system 180 transmits data to the load balancing server. This is illustrated at step 415. In one embodiment, an environmental system sends temperature readings of the storage systems connected to the system. The frequency in which information is sent to the load balancing server can be configured to meet the needs of the particular system. For example, a temperature reading can be sent every five minutes or when an adverse environmental condition is read by a sensor. However, other increments can be used.

Further, as the load balancing server receives information regarding the storage system and the environmental conditions, the process proceeds by determining whether a pre-configured triggering event has occurred. This is illustrated at step 420. As previously discussed, a triggering event can be any condition a user wishes to use as an initiator for the data integrity check process. In some embodiments, a temperature threshold is used as a triggering event along with a time period of offline storage systems. However, any environmental condition can be used as the triggering event.

Upon determining that a triggering event has not occurred, the process proceeds at step 425 by continuing to wait the time period set for offline storage system to execute the integrity check. For example, if the system does not receive an environmental triggering event, then the predetermined length of time will eventually trigger. The process can wait for that period to occur. In some embodiments, while the system is waiting for the time period trigger to occur, the system is also monitoring the environmental conditions which can transmit a triggering event and initiate the integrity check process. For example, a system can be configured to execute the integrity check for offline storage systems that have been offline for two weeks. However, during the waiting period, an environmental condition can also trigger the integrity process while the system waits the two weeks. The wait period can be configured to reset after every integrity check or it can be configured to run after a time period regardless of whether or not an integrity check process has occurred during that time period or not.

Upon determining that a triggering event has occurred, the system proceeds by initiating the integrity check process 300 of FIG. 3. As previously described, the integrity check process begins by having the load balancing server power on a storage system containing storage drives. This is illustrated at step 440. In one embodiment, a load balancing server is instructed by a service host that selects the storage system to power on based on whether the storage system is associated with a triggering event that has occurred. Once the storage system is powered on and able to communicate with the load balancing server, the service host instructs a storage controller associated with the storage system to run the integrity check process 300. This is illustrated at step 450.

Storage controllers of storage drives contained in the storage system each perform the integrity check for each storage drive. This is illustrated at step 460. In some embodiments, a storage system comprises of a storage controller capable of performing the integrity check on all the storage drives at once. As the integrity check process occurs for each drive, information of the process is sent back to the storage system and an overall bit error rate is reported, a record of uncorrectable data is reported, and other information pertinent to the process is all reported. After all the information is received, that information is then sent to the load balancing server and the storage system is powered down at 470.

Figure 5:
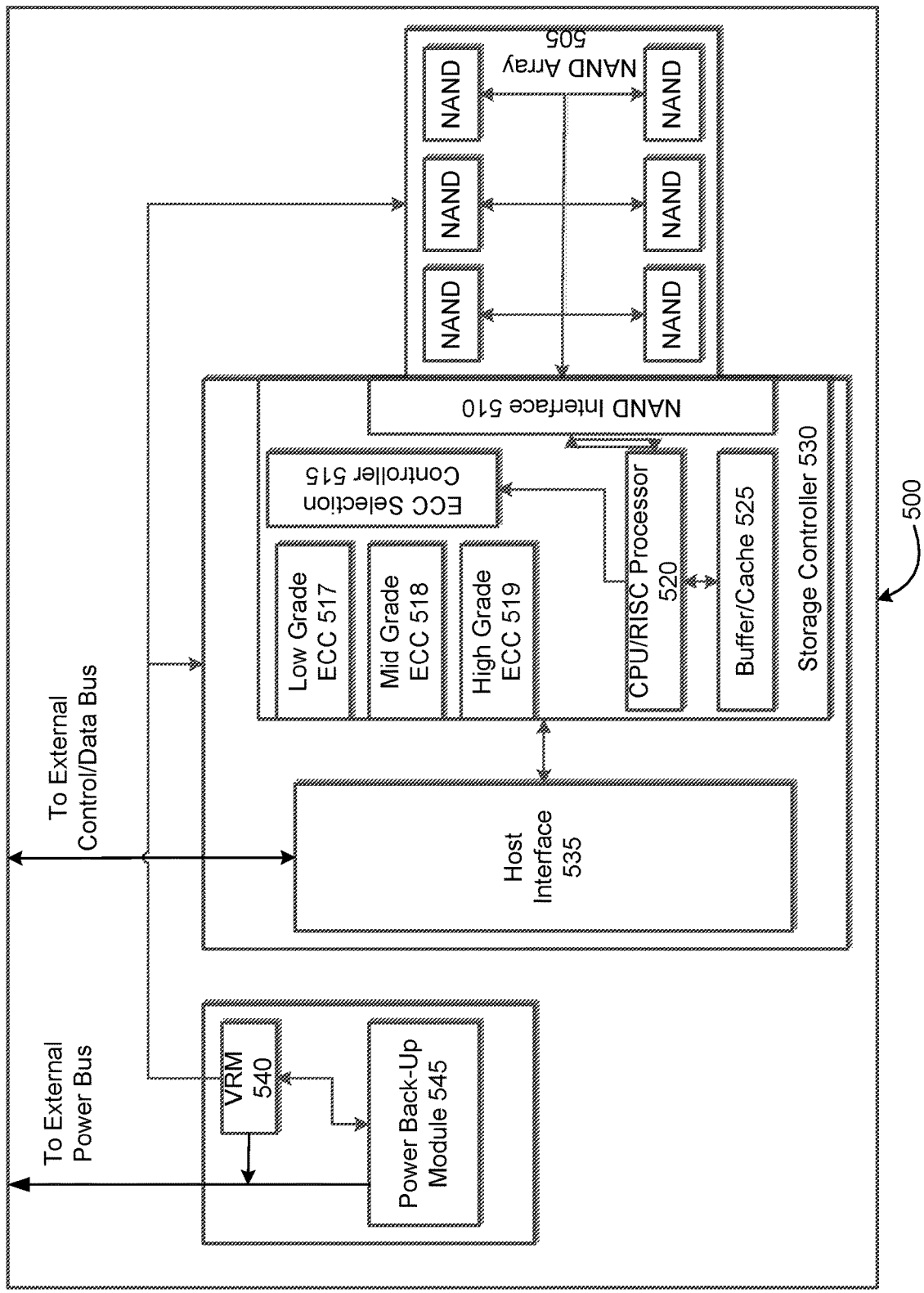
FIG. 5 is a block diagram of a NAND-based storage drive, according to embodiments.

FIG. 5 is a block diagram illustrating a nonlimiting example of a nonvolatile memory-based storage drive 500 configured as a NAND-based solid state drive (SSD), according to an illustrative embodiment of the present disclosure. The storage drive 500 comprises a NAND array 505, a NAND interface 510, an ECC selection controller 515, low grade ECC 517, mid grade ECC 518, high grade ECC 519, a CPU/RISC processor 520, buffer/cache 525, a storage controller 530, a host interface 535, voltage regulator modules (VRM) 540, and a power back-up module 545.

The NAND array 505 is a structure of NAND memory cells that store information. In one embodiment, the memory cells comprise of floating-gate transistors that are used to retain the information. A floating-gate transistor is a semiconductor capable of holding an electrical charge in a memory device (e.g., a NAND array) that is used to store data. The memory cells can be configured as single-level cells, multi-level cells, and triple-levels cells. However, the arrangement of the memory cells can also be any configuration capable of storing NAND based memory.

The power back-up module 545 regulates and provides power to the storage device 500 and is electronically connected to the VRM 540. The VRM 540 converts power to the desired voltage for the components and circuitry, which may supply a fixed voltage or a dynamically changing supply voltage depending on the load to the storage drive 500.

A storage controller 530 is a structure comprising of a NAND interface 510, ECC selection controller 515, a low grade ECC 517, a mid grade ECC 518, a high grade ECC 519, a processor 520, a cache 525, and a host interface 535. In one embodiment, the storage controller 530 is a device that controls the NAND array 505 by incorporating the aforementioned components and acts as a bridge to a host computer or device. The processor 520 executes firmware-level code as needed by the storage device. The processor 520 interacts with the NAND interface 510 to access and manipulate the NAND array when required by the code.

An ECC selection controller 515 is configured to manage the error correction and to detect and correct errors by selecting an appropriate error-correcting code (ECC) to perform the correction. The ECC controller is also configured to receive information on the errors detected by the processor 520. For example, the information may include the address associated with a read command that was detected as having an error.

In some embodiments, the ECC selection controller 515 is configured to select an ECC based on the bit error rate detected on a storage drive the ECC controller 515 is electronically connected to. For example, the selection controller 515 can be configured to choose an ECC on the basis of a preconfigured bit error rate threshold. If the detected bit error rate is less than the threshold, then the selection controller 515 selects a low grade ECC 517. However, if the bit error rate is higher than the threshold, the selection controller 515 can select a higher grade ECC (e.g., mid grade ECC 518, high grade ECC 519) based on a pre-determined method. Embodiments of the disclosure may implement various methods of selecting an ECC, and are not limited to the examples described herein.

For error detection and correction to occur within a storage drive, the inclusion of redundant information is needed. Specialized hardware or software utilizes the redundant information to perform the detection and correction of the stored data. Each sector or page of data make up a certain number of bits of data. Also included in the bits of data are additional bits for implementing error correcting code or ECC (also referred to as error correction code or error correcting circuits). The additional bits of data are used to detect and correct any errors that may occur within the data bits. Various algorithms are used to detect and correct the errors but can vary based on computational time, effectiveness, and available resources. As such, a process for picking an appropriate ECC may be implemented into the data integrity check process based on the errors detected during the process.

Figure 6:
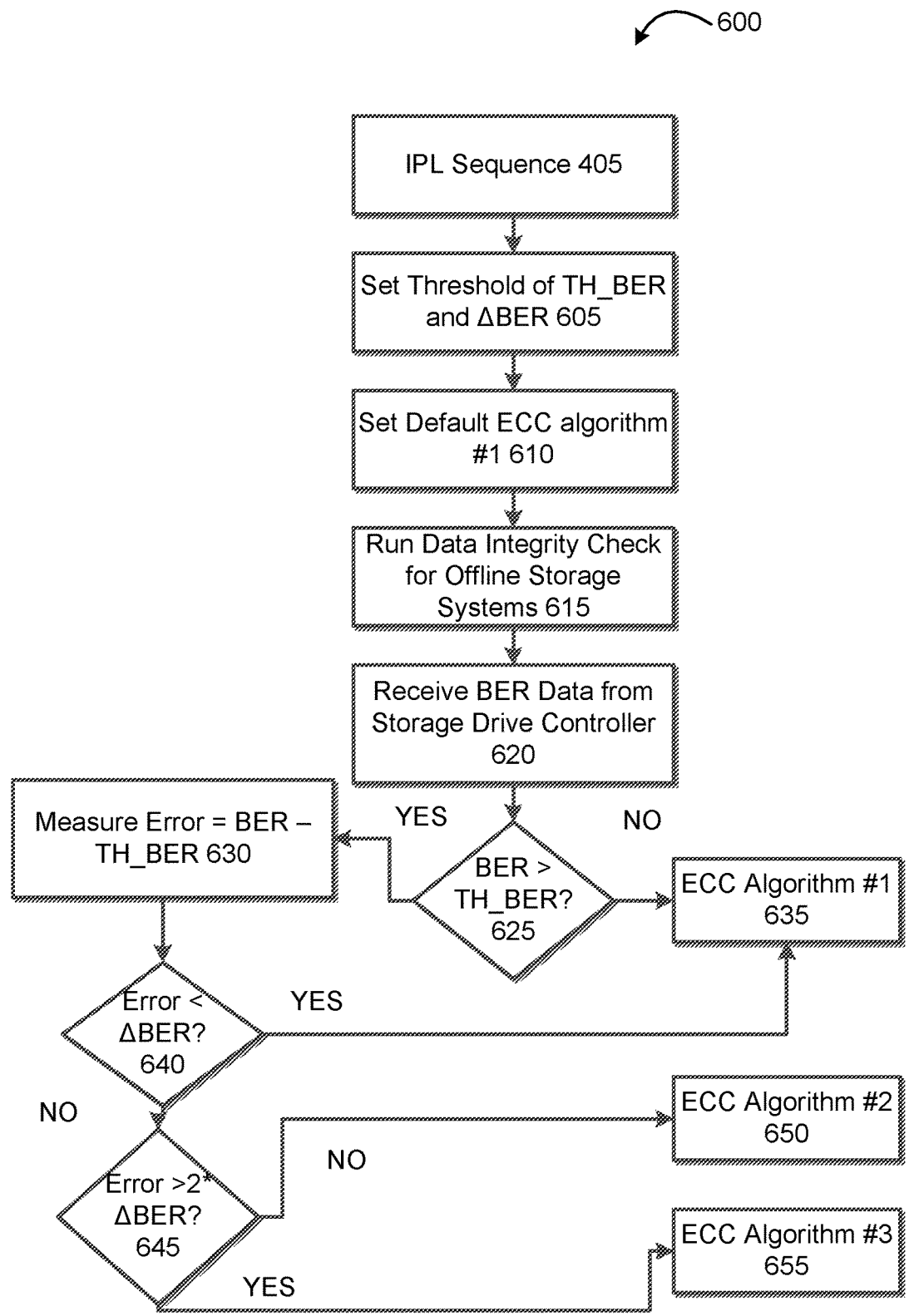
FIG. 6 is a flow diagram illustrating a process of error-correcting code selection in a data integrity check process, according to embodiments.

FIG. 6 is a flow diagram illustrating a data center performing the data integrity check process 300 of FIG. 3 and incorporating an error-correcting code (ECC) selection process 600, according to embodiments of the present disclosure. The process begins by initiating an IPL sequence of FIG. 4. As previously discussed, the IPL sequence comprises the steps of system and storage initialization. During the IPL sequence, the pre-defined conditions for the data integrity check process are set. This is illustrated at step 605. The integrity check process is adaptable to allow for a multitude of various conditions. Such conditions include a time period, a bit error rate threshold (TH_BER), a bit error rate increment (ΔBER), and a time period increment.

In one embodiment, the data integrity check process includes conditions for a time period, a bit error rate threshold, and a bit error rate increment. The addition of the bit error rate increment introduces an additional aspect to the bit error rate process in which differing grades of error-correcting code are selected based on the amount of errors detected on a storage device. In another embodiment that further expands the previous embodiment, a default error-correcting code algorithm is selected as a base level algorithm. This is illustrated at step 610. A default ECC is used as the primary ECC algorithm used for detected errors. Unless otherwise prompted, a storage device will use the default ECC to correct the errors. However, other ECC algorithms can be embedded into a storage controller of a storage drive to allow for other ECC algorithms to be used based on conditions that are met. For example, a default ECC can be a low grade ECC that is capable of correcting a small number of errors in a quick and efficient manner. While a mid grade ECC can be used for a larger amount of errors that may require a more robust algorithm, and a high grade ECC can be used for the highly corrupted data that needs intensive correction. The more advanced error correction algorithms tend to be slower and more complex than the regular correction protocols but have an increased chance of success.

Once a default ECC is set, the data center is set to run the data integrity check process. This is illustrated at step 615. The integrity check process proceeds in the same way as indicated in FIG. 3 and will wait until a pre-defined triggering event occurs. Upon receiving a triggering event, a storage drive is powered at step 620 and a bit error rate for the storage drive is calculated. In one embodiment, a storage system, containing a plurality of storage drives, is powered on and each storage drive calculate a bit error rate to provide a total bit error rate for the storage system. For example, the storage drive bit error rates can be added together to give a bit error rate, not for the individual drives, but rather for the storage system as a whole.

A determination is made to calculate whether the bit error rate detected is above or below the pre-configured bit error rate threshold. This is illustrated at step 625. If the bit error rate does not exceed the bit error rate threshold, then the default ECC algorithm is selected to perform the corrections on the storage drive, as illustrated at step 635. For example, if a bit error rate does not a rating 1 in $10^{14}$ bit error threshold then the default ECC can be used if the bit error rate threshold is set to that amount.

Upon determining that the bit error rate exceeds the bit error rate threshold, then a measurement of the error is conducted. This is illustrated at step 630. The error measurement is calculated by subtracting the bit error rate threshold from the calculated bit error rate. In one embodiment, the measured error is used to select difference ECC algorithms. A calculation is conducted to determine whether the error is less than the bit error rate increment. This is illustrated at step 640. If the error is less than the bit error rate threshold, then the default algorithm is chosen to correct the errors detected on the device.

Upon determining that the measured error exceeds the bit error rate threshold, then another measurement is conducted. The error is measured to determine what other error-correcting code is to be used to correct the storage drive. A higher grade of error correction may be needed as the amount of errors detected increases. As such, the measurement determines whether the error exceeds two times the bit error rate increment. This is illustrated at step 645. If the measured error does not exceed than two times the bit error rate increment, then the mid grade ECC algorithm is selected. This is illustrated at step 650. If the measured error exceeds two times the bit error rate increment, then the high grade ECC algorithm is selected. This is illustrated at step 655.

After completing the ECC, be it at step 635, 650, or 655, the process proceeds in the same manner discussed in FIG. 3. However, in the absence of an environmental triggering event, the data integrity check process proceeds after some predefined time period triggering event as illustrated in FIG. 4. The storage drive provides a page detail for any errors found to be uncorrectable and concludes by powering down the storage drive. In one embodiment, a storage system is powered down when all the storage drives stored within the storage system have completed the data integrity check process and have a page detailed.

Selecting the ECC algorithms based on the measured error is just one approach that can be utilized. Other techniques and approaches may be used to determine which ECC is selected to correct the errors in a storage drive.

One aspect of the data integrity check process is that the time period between each run of the process can be independently set by a user. Much like the bit error rate threshold and the triggering events, the time period is a preconfigured prior to the operation of the data integrity check process. This is to allow for the various needs of a system. For example, a data centers located in hotter areas may want to monitor offline storage devices with greater frequency than data centers in colder areas. If a data center contains storage drives that are historically unreliable, a shorter time period can be set to ensure that the retained data is still intact and operable. Adjustment to the time period is introduced to allow for determining an optimal interval of time between runs of the data integrity check process.

Figure 7:
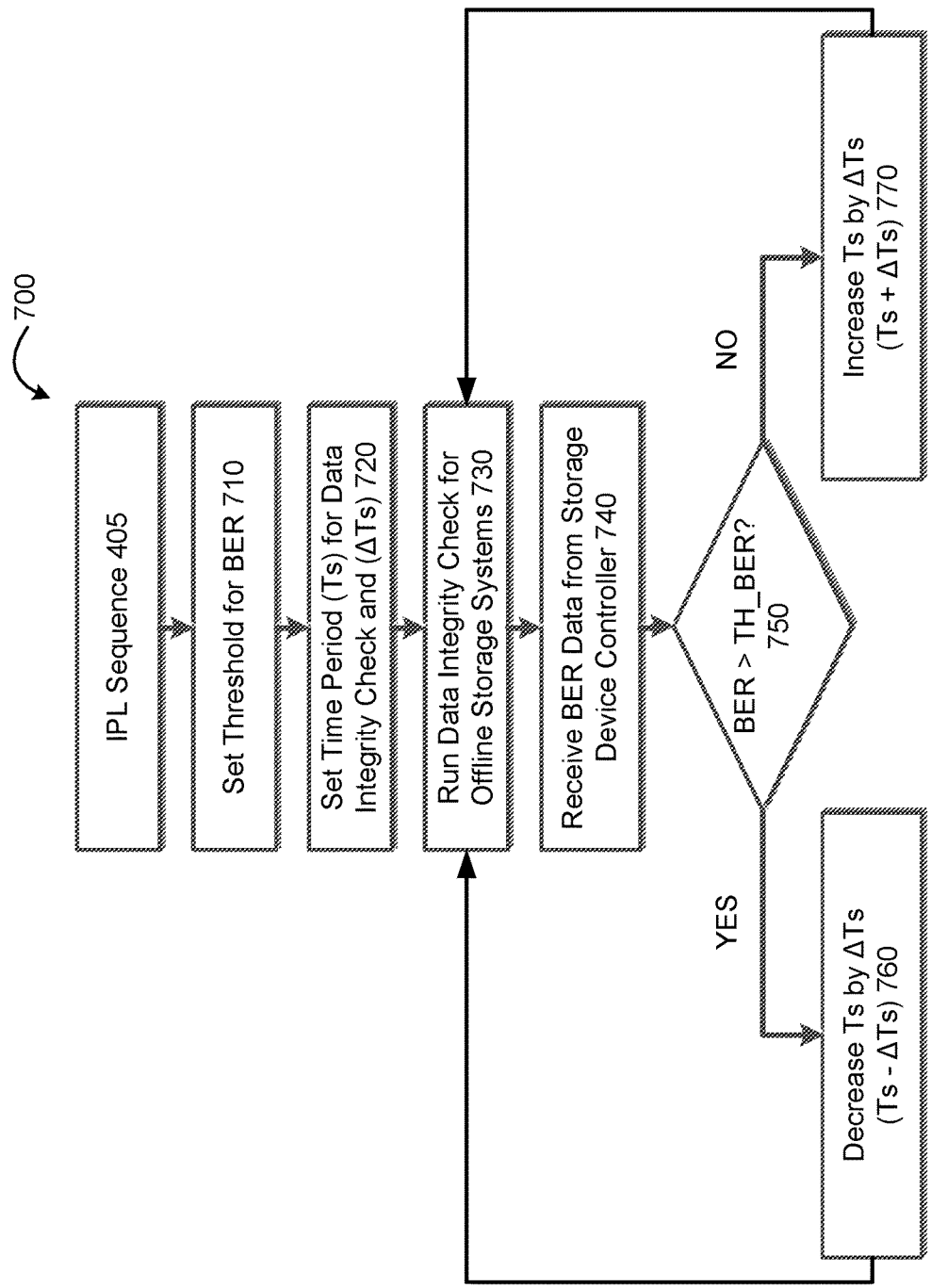
FIG. 7 is a flow diagram illustrating a process of time period adjustment in a data integrity check process, according to embodiments.

FIG. 7 is a flow chart illustrating a time period adjuster process 700 that adjusts the time period based on the bit error rate, according to one illustrative embodiment of the present disclosure. The time period adjuster process 700 can be implemented into the data integrity check process of FIG. 3 to allow for adjustments to be made to the preconfigured time period. FIG. 7 illustrates an embodiment that operates within a data center. FIG. 7 begins within the IPL sequence 405. While the IPL sequence is occurring the bit error rate threshold is set, as illustrated at step 710. A time period (Ts) and a time period increment (ΔTs) are set at step 720. The time period increment is used to adjust the time period after the data integrity check process completes its operation. For example, the time period increment can be set at an increment of two days in which the time period is adjusted by two days after every run. However, other time periods can be used.

Once the conditions are set, the data integrity check is run in the same manner as it would in any of the aforementioned embodiments. This is illustrated at step 730. During the process, the bit error rate is analyzed to determine whether it exceeds the bit error rate threshold. Shown at step 750. This analysis already occurs within the integrity check process, so the time period adjuster 700 need only utilize that information to make its determination. This is illustrated at step 740.

Upon determining that the bit error rate exceeds the bit error rate threshold, the time period is decreased by the time period increment. This is illustrated at step 760. For example, if a time period is set to fourteen days and a time period increment is set to two days, then the time period would be adjusted to twelve days. After twelve days, when the data integrity check occurs and the bit error rate exceeds the bit error rate threshold, the time period would again be adjusted to ten days, and so on. This can help retain information if errors are detected above a given threshold, then the storage drive may be more susceptible to error and may require more frequent error correction. In one embodiment, a service host executing the data integrity check process is configured to decrease the time period.

Upon determining that the bit error rate does not exceed the bit error rate threshold, the time period is increased by the time period increment. This is illustrated at step 770. Using a similar example as above, if a time period is set to fourteen days and a time period increment is set to two days, then the time period would be adjusted to 16 days. As storage drives or storage systems report few bit error rates, the need for continuous monitoring by the integrity check process lessens. As such, the increase of time between checks is implemented because low bit error rates indicate a healthy and stable system.

Figure 8:
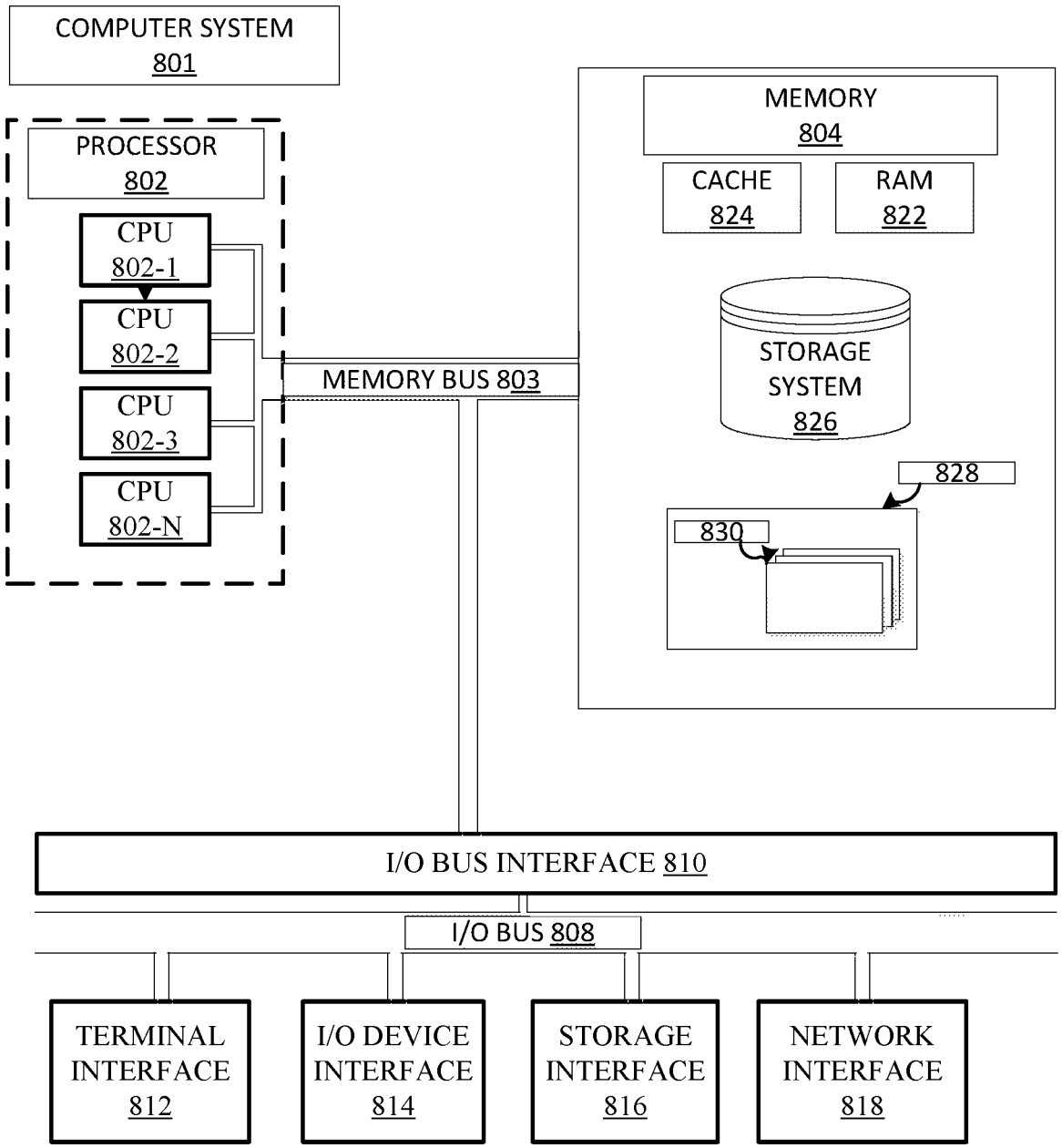
FIG. 8 is a block diagram illustrating a computing system according to one embodiment.

Referring now to FIG. 8, shown is a high-level block diagram of an example computer system 801 (e.g., vehicle controls remapping system 100, server 180) that may be used in implementing one or more of the methods, tools, and modules, and any related functions, described herein (e.g., using one or more processor circuits or computer processors of the computer), in accordance with embodiments of the present disclosure. In some embodiments, the major components of the computer system 801 may comprise one or more CPUs 802, a memory subsystem 804, a terminal interface 812, a storage interface 816, an I/O (Input/Output) device interface 814, and a network interface 818, all of which may be communicatively coupled, directly or indirectly, for inter-component communication via a memory bus 803, an I/O bus 808, and an I/O bus interface unit 810.

The computer system 801 may contain one or more general-purpose programmable central processing units (CPUs) 802-1, 802-2, 802-3, and 802-N, herein generically referred to as the CPU 802. In some embodiments, the computer system 801 may contain multiple processors typical of a relatively large system; however, in other embodiments the computer system 801 may alternatively be a single CPU system. Each CPU 802 may execute instructions stored in the memory subsystem 804 and may include one or more levels of on-board cache.

System memory 804 may include computer system readable media in the form of volatile memory, such as random access memory (RAM) 822 or cache memory 824. Computer system 801 may further include other removable/non-removable, volatile/non-volatile computer system storage media. By way of example only, storage system 826 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 804 can include flash memory, e.g., a flash memory stick drive or a flash drive. Memory devices can be connected to memory bus 803 by one or more data media interfaces. The memory 804 may include at least one program product having a set (e.g., at least one) of program modules that are configured to carry out the functions of various embodiments.

Although the memory bus 803 is shown in FIG. 8 as a single bus structure providing a direct communication path among the CPUs 802, the memory subsystem 804, and the I/O bus interface 810, the memory bus 803 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 810 and the I/O bus 808 are shown as single respective units, the computer system 801 may, in some embodiments, contain multiple I/O bus interface units 810, multiple I/O buses 808, or both. Further, while multiple I/O interface units are shown, which separate the I/O bus 808 from various communications paths running to the various I/O devices, in other embodiments some or all of the I/O devices may be connected directly to one or more system I/O buses.

In some embodiments, the computer system 801 may be a multi-user mainframe computer system, a single-user system, or a server computer or similar device that has little or no direct user interface, but receives requests from other computer systems (clients). Further, in some embodiments, the computer system 801 may be implemented as a desktop computer, portable computer, laptop or notebook computer, tablet computer, pocket computer, telephone, smart phone, network switches or routers, or any other appropriate type of electronic device.

It is noted that FIG. 8 is intended to depict the representative major components of an exemplary computer system 801. In some embodiments, however, individual components may have greater or lesser complexity than as represented in FIG. 8, components other than or in addition to those shown in FIG. 8 may be present, and the number, type, and configuration of such components may vary.

One or more programs/utilities 828, each having at least one set of program modules 830 may be stored in memory 804. The programs/utilities 828 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 828 and/or program modules 830 generally perform the functions or methodologies of various embodiments.

In embodiments, the program modules 830 can include a data integrity check module on offline storage drives. The module receives a triggering event that corresponds to the storage drive. The triggering event that is received is a predetermined condition. Next, the module powers on the storage drive and selects a page held within the storage drive. Once the page is selected, the module determines a bit error rate of the page. Once a bit error rate is calculated, the module determines whether the bit error rate exceeds a bit error rate threshold. The bit error rate threshold is a predetermined threshold that is set prior to the operation of the process. Upon determining that the bit error rate exceeds the bit error rate threshold, the module scrubs all pages held within the storage drive. Upon determining that the bit error rate does not exceed the bit error rate threshold, the module scrubs the page. The module then records corrupted data within the storage drive and powers down the storage drive.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method for data integrity in a storage drive, the process comprising:
   receiving, by a service host, a triggering event, from an environmental monitoring server, corresponding to the storage drive, the triggering event corresponding to a predetermined condition;
   powering on the storage drive by a power management unit, wherein the storage drive was powered off prior to the triggering event;
   selecting, by the service host, a page from the storage drive, wherein the page is a data segment within the storage drive;
   determining, by the storage drive, a bit error rate of the page, wherein the bit error rate is determined by a storage controller connected within the storage drive;
   upon determining that the bit error rate exceeds a bit error rate threshold, running, by the storage drive, a first error correcting code to scrub all pages held within the storage drive;
   upon determining that the bit error rate does not exceeds a threshold, running, by the storage drive, the first error correcting code to scrub the page;
   recording, by the storage drive, uncorrectable errors within the storage drive after scrubbing the storage drive; and
   powering down, by the power management unit, the storage drive.

2. The process of claim 1, wherein running the first error correcting code to scrub all pages held within the storage drive further comprises:
   reading all pages held within the storage drive;
   correcting, based on a bit error, data bits held within all pages;
   determining, based on correcting, corrupted pages; and
   writing the data bits back to all pages.

3. The process of claim 1, wherein powering on comprises:
   powering on a storage system corresponding to the triggering event, wherein the storage system is operatively coupled to the storage drive and powers on the storage drive.

4. The process of claim 3, wherein the predetermined condition is a time period, the time period being a length of time that the storage system has been powered off.

5. The process of claim 3, wherein the predetermined condition is a temperature threshold for the storage system.

6. The process of claim 1, wherein the page is selected across the storage drive.

7. The process of claim 1, wherein upon determining that the bit error rate exceeds the bit error rate threshold, the method further comprises:
   upon determining that the bit error rate exceeds the bit error rate threshold, selecting the first error correcting code;
   determining an error measurement, wherein the error measurement is the bit error rate minus the bit error rate threshold;
   determining whether the error measurement exceeds the bit error rate threshold;
   upon determining that the error measurement does not exceed the bit error rate threshold, running the first error correcting code to scrub all pages held within the storage drive;
   upon determining that the error measurement exceeds the bit error rate threshold, determining whether the error measurement exceeds two times the bit error rate threshold;
   upon determining that the error measurement does not exceed two times the bit error rate threshold, running a second error correcting code to scrub all pages held within the storage drive; and
   upon determining that the error measurement exceeds two times the bit error rate threshold, running a third error correcting code to scrub all pages held within the storage drive.

8. The process of claim 3, wherein the page is selected from a hot spot area in the storage system, the hot spot being an area of the storage drive that exceeds a temperature threshold.

9. The process of claim 4, further comprising:
   upon determining that the bit error rate does not exceed the bit error rate threshold, increasing the time period by a time period increment; and
   upon determining that the bit error rate exceeds the bit error rate threshold, decreasing the time period by the time period increment.

10. A system for improving data retention in a storage system, the system comprising:
    a storage drive configured to store data, wherein the data is divided into pages of information;
    a storage system connected to the storage drive, the storage system configured to manage the data held within the storage drive;
    a load balancing server configured to distribute network traffic;
    a power management unit connected to the load balancing server and to the storage system, the power management unit configured to communicate a power status of the storage system to the load balancing server, the power management further configured to supply power to the storage system;
    an environmental monitoring server connected to the load balancing server, the environmental monitoring server configured to monitor and sense a plurality of environmental conditions and to communicate the plurality of environmental conditions to the load balancing server;
    a service host configured to execute an instruction on the storage system upon determining a triggering event, the service host further configured to receive the environmental conditions and the power status to determine the triggering event; and
    wherein the storage drive is further configured to receive the instruction from the service host and to check the pages for a bit error rate, to scrub the pages containing errors, and to record each page that contains an uncorrectable error.

11. The system of claim 10, wherein the triggering event is determined to occur after a predetermined time period, wherein the predetermined time period is set by the service host.

12. The system of claim 11, further comprising:
the service host further configured to increase the time period by a time period increment when the bit error rate does not exceed a bit error rate threshold and to decrease the predetermined time period by the time period increment when the bit error rate exceeds the bit error rate threshold.

13. The system of claim 10, wherein the triggering event is configured to occur after a temperature threshold is reached at the storage system, the temperature threshold having a predetermined temperature set by the service host.

14. A computer program product for data integrity, the computer program product comprising a computer readable storage medium having program instructions embodied therewith, the program instructions executable by a processor to cause the processor to:
receive a triggering event corresponding to a storage drive, the triggering event being a predetermined condition;
power on a storage drive, the storage drive being offline prior to the triggering event;
select a page from the storage drive, wherein the page is a data segment within the storage drive;
determine a bit error rate of the page, wherein the bit error rate is determined by a storage controller connected within the storage drive;
upon determining that the bit error rate exceeds a bit error rate threshold, run a first error correcting code to scrub all pages held within the storage drive;
upon determining that the bit error rate does not exceeds a threshold, run the first error correcting code to scrub the page;
record uncorrectable errors within the storage drive after scrubbing the storage drive; and
power down the storage drive.

15. The computer program product of claim 14, wherein the instructions which cause at least one processor to run the first error correcting code to scrub all pages held within the storage drive further comprises instructions to:
read all pages held within the storage drive;
correct, based on a bit error, data bits held within all pages;
determine, based on correcting, any uncorrectable errors, and
writing the data bits back to all pages.

16. The computer program product of claim 14, wherein upon determining that the bit error rate exceeds the bit error rate threshold, further comprises instructions to:
upon determining that the bit error rate exceeds the bit error rate threshold, select the first error correcting code;
measure an error measurement, wherein the error measurement is the bit error rate minus the bit error rate threshold;
determine whether the error measurement exceeds the bit error rate threshold;
upon determining that the error measurement does not exceed the bit error rate threshold, run the first error correcting code to scrub all pages held within the storage drive;
upon determining that the error measurement exceeds the bit error rate threshold, determine whether the error measurement exceeds two times the bit error rate threshold;
upon determining that the error measurement does not exceed two times the bit error rate threshold, run a second error correcting code to scrub all pages held within the storage drive; and
upon determining that the error measurement exceeds two times the bit error rate threshold, run a third error correcting code to scrub all pages held within the storage drive.

17. The computer program product of claim 14, wherein power on comprises instructions:
power on a storage system corresponding to the triggering event, wherein the storage system is operatively coupled to the storage drive and powers on the storage drive.

18. The computer program product of claim 14, wherein the predetermined condition is a time period, the time period being a length of time that the storage system has been powered off.

19. The computer program product of claim 18, further comprising instructions to:
upon determining that the bit error rate does not exceed the bit error rate threshold, increase the time period by a time period increment; and
upon determining that the bit error rate exceeds the bit error rate threshold, decrease the time period by the time period increment.

20. The computer program product of claim 17, wherein the page is selected from a hot spot in the storage system, the hot spot being an area of the storage drive that exceeds a temperature threshold.

\* \* \* \* \*